(12) United States Patent
Morimoto et al.

(10) Patent No.: US 9,269,841 B2
(45) Date of Patent: Feb. 23, 2016

(54) CIS-BASED THIN FILM SOLAR CELL

(75) Inventors: Takuya Morimoto, Tokyo (JP); Hiroki Sugimoto, Tokyo (JP); Hideki Hakuma, Tokyo (JP)

(73) Assignee: SOLAR FRONTIER K.K., Tokyo (JP)

(*) Notice: Subject to any disclaimer, the term of this patent is extended or adjusted under 35 U.S.C. 154(b) by 401 days.

(21) Appl. No.: 13/702,458

(22) PCT Filed: Jun. 16, 2011

(86) PCT No.: PCT/JP2011/063797
§ 371 (c)(1),
(2), (4) Date: Feb. 26, 2013

(87) PCT Pub. No.: WO2011/158900
PCT Pub. Date: Dec. 22, 2011

(65) Prior Publication Data
US 2013/0146137 A1    Jun. 13, 2013

(30) Foreign Application Priority Data

Jun. 17, 2010 (JP) .................................. 2010-138356

(51) Int. Cl.
| H01L 31/0224 | (2006.01) |
| H01L 31/0749 | (2012.01) |
| H01L 31/046 | (2014.01) |
| H01L 31/0463 | (2014.01) |
| H01L 31/032 | (2006.01) |

(52) U.S. Cl.
CPC *H01L 31/022441* (2013.01); *H01L 31/022425* (2013.01); *H01L 31/046* (2014.12); *H01L 31/0749* (2013.01); *H01L 31/0322* (2013.01); *H01L 31/0463* (2014.12); *Y02E 10/541* (2013.01)

(58) Field of Classification Search
None
See application file for complete search history.

(56) References Cited

U.S. PATENT DOCUMENTS

| 5,981,864 A | 11/1999 | Mizutani et al. | |
| 2005/0253142 A1* | 11/2005 | Negami et al. | 257/65 |
| 2007/0163646 A1* | 7/2007 | Kushiya et al. | 136/264 |

FOREIGN PATENT DOCUMENTS

| JP | 04-116986 A | 4/1992 |
| JP | 09-260695 A | 10/1997 |

(Continued)

OTHER PUBLICATIONS

International Search Report for PCT/JP2011/063797, mailing date of Jul. 19, 2011.

*Primary Examiner* — Jeffrey T Barton
*Assistant Examiner* — Meisha Binkley
(74) *Attorney, Agent, or Firm* — Westerman, Hattori, Daniels & Adrian, LLP

(57) ABSTRACT

A CIS-based thin film solar cell has a backside electrode layer that is divided by a pattern (P1), and a CIS-based light absorption layer, and a transparent conductive film are sequentially formed on a substrate. The backside electrode layer comprises an intermediate layer on the surface that is in contact with the CIS-based light absorption layer, the intermediate layer being composed of a compound of a metal that constitutes the backside electrode layer and a group VI element that constitutes the CIS-based light absorption layer; the intermediate layer comprises a first intermediate layer portion which is formed on the upper surface and a second intermediate layer portion which is formed on the lateral surface that and faces the pattern (P1); and the film thickness of the second intermediate layer portion is larger than the film thickness of the first intermediate layer portion.

3 Claims, 8 Drawing Sheets

(56) References Cited

FOREIGN PATENT DOCUMENTS

| JP | 2002-203976 | A | 7/2002 |
| JP | 2002-319686 | A | 10/2002 |
| JP | 2009-170928 | A | 7/2009 |
| JP | 2009-289955 | A | 12/2009 |

* cited by examiner

CIS-BASED THIN FILM SOLAR CELL

TECHNICAL FIELD

The present invention relates to a low-leakage current, high-efficiency CIS-based thin film solar cell having an integrated structure, in which a plurality of unit cells are connected in series.

BACKGROUND ART

Typically, a CIS-based thin film solar cell has an integrated structure, in which a backside electrode layer formed on a substrate is divided by a dividing groove referred to as pattern 1 (P1) and a CIS-based light absorption layer (hereinafter referred to as "light absorption layer") and transparent conductive film formed on the backside electrode layer are divided by dividing grooves referred to as pattern 2 (P2) and pattern 3 (P3), whereby a plurality of unit cells are connected in series.

In a prior art CIS-based thin film solar cell, a shunt path (20c) is formed through the light absorption layer between the adjacent regions of the backside electrode layer divided by pattern 1 (P1) and a leakage current flowing through the shunt path (20c) causes problems of reduction of conversion efficiency of a solar cell.

Several methods have been developed to obviate the aforementioned problems. One of the methods involves fabricating an insulating material between the adjacent regions of the backside electrode layer divided by pattern 1 (P1) to reduce the influence of leakage current on the shunt path (20c) (see, for example, Patent document 1.)

Other methods involve a process of expanding the width of pattern 1 (P1) to increase the distance between the regions of the backside electrode layer adjacent to pattern 1 (P1) thereby to reduce the influence of leakage current on the shunt path (20c).

CITATION LIST

Patent Documents

Patent document 1: Japanese Patent Application Publication No. Hei 04-116986

SUMMARY OF INVENTION

Technical Problem

However, incorporating such a structure as described above, which is not indispensable for a CIS-based thin film solar cell, necessitates additional processing steps, which, in turn, could affect an essential structure of a solar cell and result in an increase in manufacturing cost.

Thus, there has been a demand for a new approach to a thin film solar cell design that could reduce the leakage current on a shunt path (20c) without requiring special materials or additional processes.

Furthermore, a greater width of pattern 1 (P1) leads to a smaller area for generating electric energy, which results in lower conversion efficiency.

To overcome the aforementioned limitations and problems of the prior art, the present invention provides a high-efficiency CIS-based thin film solar cell, reducing the leakage current without adding special processes to conventional fabrication processes.

Solution to Problem

A CIS-based thin film solar cell in accordance with an embodiment of the present invention is that fabricated by sequentially depositing a backside electrode layer divided by a dividing groove, a CIS-based light absorption layer and a transparent conductive film, wherein said backside electrode layer comprises an intermediate layer on the surface that is in contact with the CIS-based light absorption layer, said intermediate layer being composed of a compound of a metal that constitutes the backside electrode layer and a group VI element that constitutes the CIS-based light absorption layer, wherein said intermediate layer comprises a first intermediate layer portion formed on the upper surface that is parallel to the substrate and a second intermediate layer portion formed on the lateral surface that is vertical to the substrate and opposed to the dividing groove, and wherein the film thickness of the second intermediate layer portion is larger than that of the first intermediate layer portion.

In accordance with another embodiment of the present invention, the film thickness of the second intermediate layer portion is at least twice as large as that of the first intermediate layer portion.

In accordance with yet another embodiment of the present invention, the backside electrode layer is made of Mo, and the group VI element includes at least sulfur and the intermediate layer consists of at least one of $MoS_2$ layer and $Mo(SSe)_2$ layer.

DESCRIPTION OF EMBODIMENTS

A structure of a CIS-based thin film solar cell of the present invention will be described, with reference to the figures below.

The CIS-based thin film solar cell of the present invention has an integrated structure, in which a solar cell formed on a substrate is divided by dividing grooves into a plurality of unit cells (hereinafter referred to as "cells"), which are connected in series.

Figure 1:
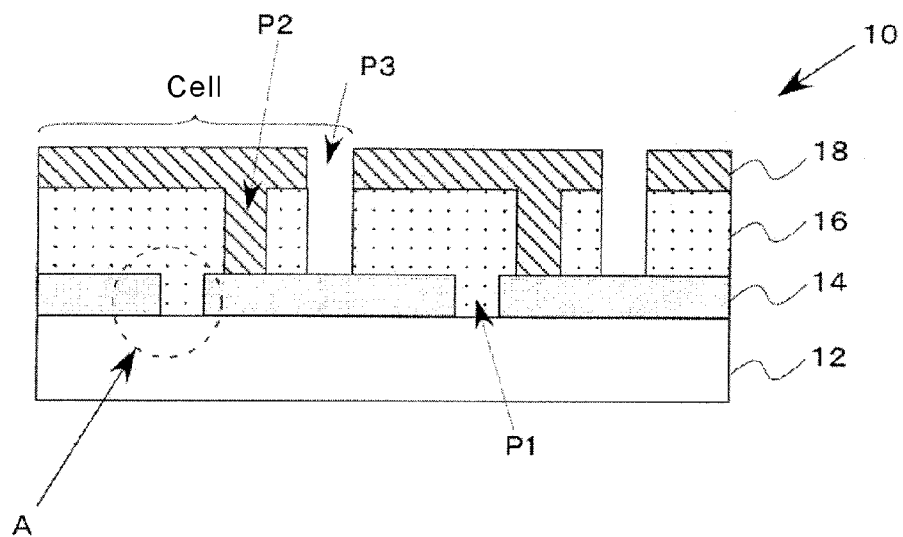
FIG. 1 is a schematic diagram illustrating an integrated structure of a CIS-based thin film solar cell in accordance with an embodiment of the present invention.

Hereafter, a basic structure of the CIS-based thin film solar cell 10 in accordance with the present embodiment will be illustrated with reference to FIG. 1. The CIS-based thin film solar cell of the present embodiment constitutes a p-n hetero junction device comprised of the backside electrode layer 14, the CIS-based light absorption layer (hereinafter referred to as "light absorption layer") 16 and the transparent conductive film 18, which are deposited sequentially on the substrate 12. The backside electrode layer 14 is divided by the first dividing groove (hereinafter referred to as "pattern 1 (P1)") formed by laser or the like, and the light absorption layer 16 and transparent conductive film 18 are divided by a second dividing groove (hereafter referred to as "pattern 2 (P2)") and a third dividing groove (hereafter referred to as "pattern 3 (P3)") formed by laser scribing, mechanical scribing or the like. Thus, the film element formed on the substrate is divided by a plurality of dividing grooves, i.e., pattern 1 (P1)-pattern 3 (P3) to create an integrated structure, in which cells are connected in series. Although the solar cell in accordance with the present embodiment has a buffer layer disposed between the light absorption layer 16 and the transparent conductive layer 18, the buffer layer is not shown in FIG. 1.

Figure 2:
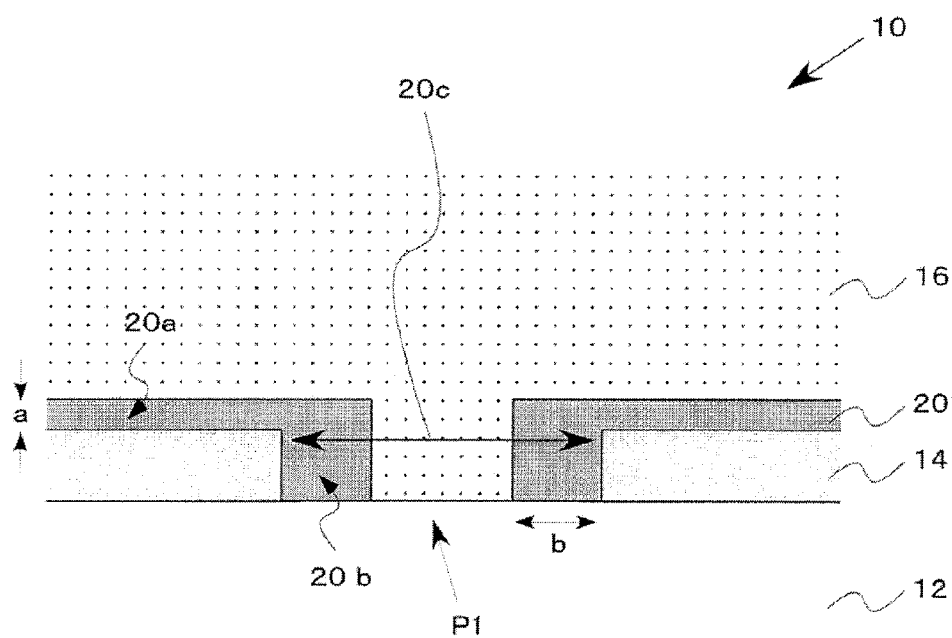
FIG. 2 is a schematic diagram showing an enlarged view of the portion marked A of the embodiment illustrated in FIG. 1.
Figure 3A:
FIG. 3a is a cross-section STEM (scanning transmission electron microscope) image of a prior art CIS-based thin film solar cell.
Figure 3B:
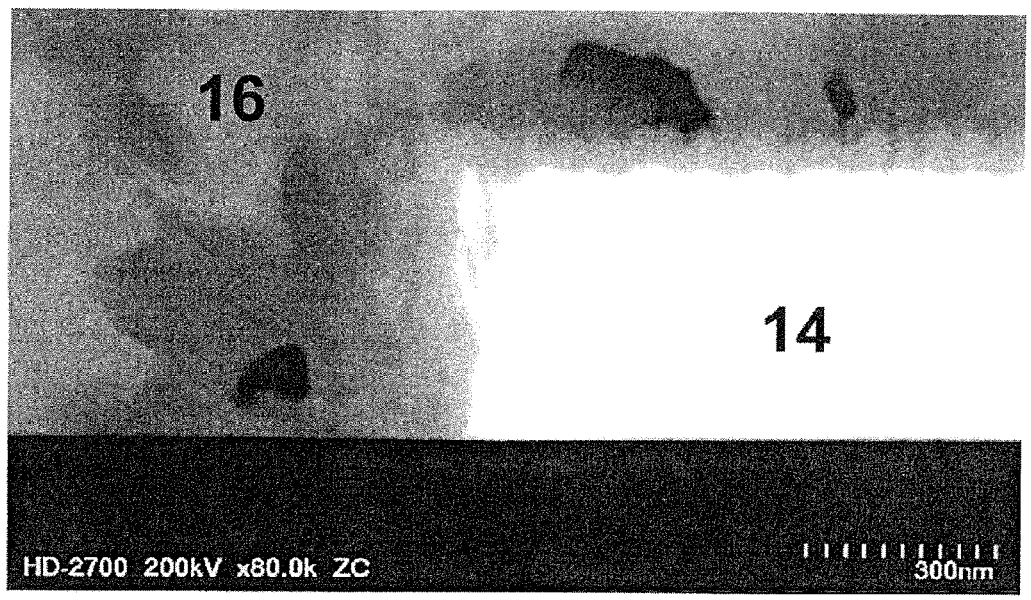
FIG. 3b is a cross-section STEM image of a CIS-based thin film solar cell in accordance with the embodiment of the present invention.
Figure 4A:
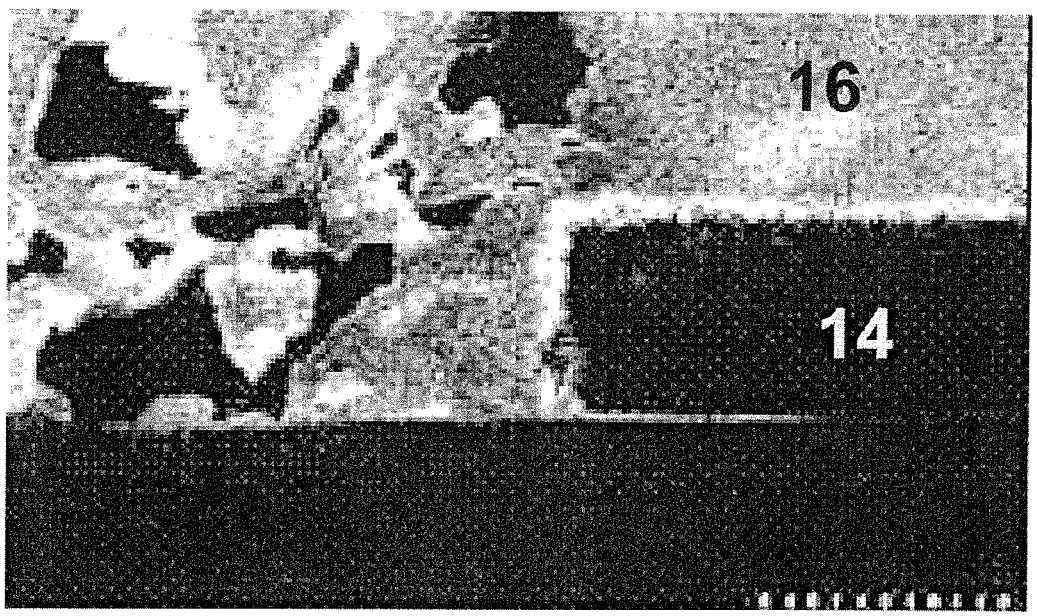
FIG. 4a is a mapping image of sulfur in the prior art CIS-based thin film solar cell using EELS (electron energy-loss spectroscopy).
Figure 4B:
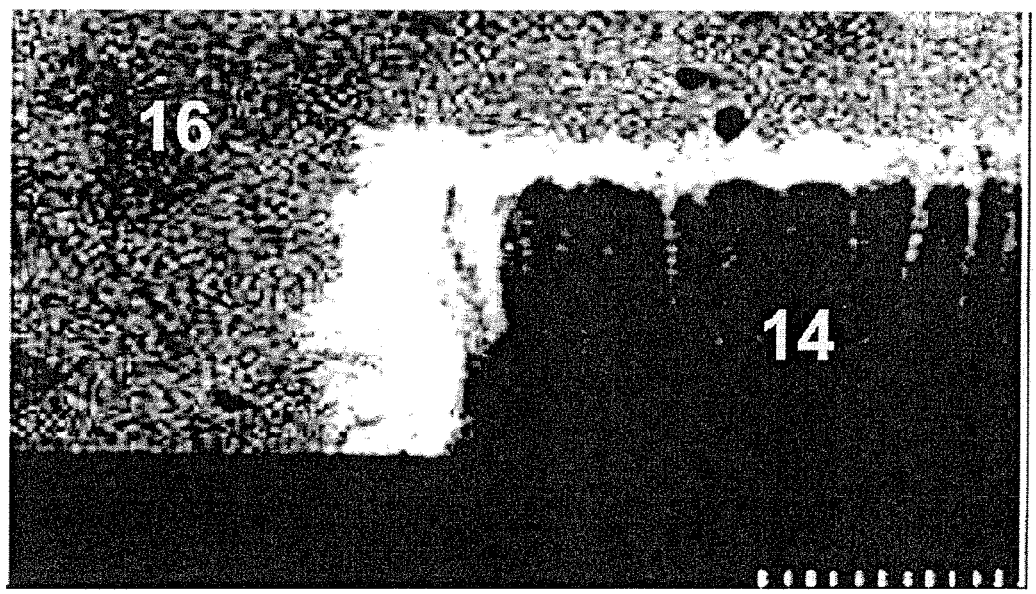
FIG. 4b is a mapping image of sulfur in a CIS-based thin film solar cell in accordance with the embodiment of the present invention using EELS.
Figure 5A:
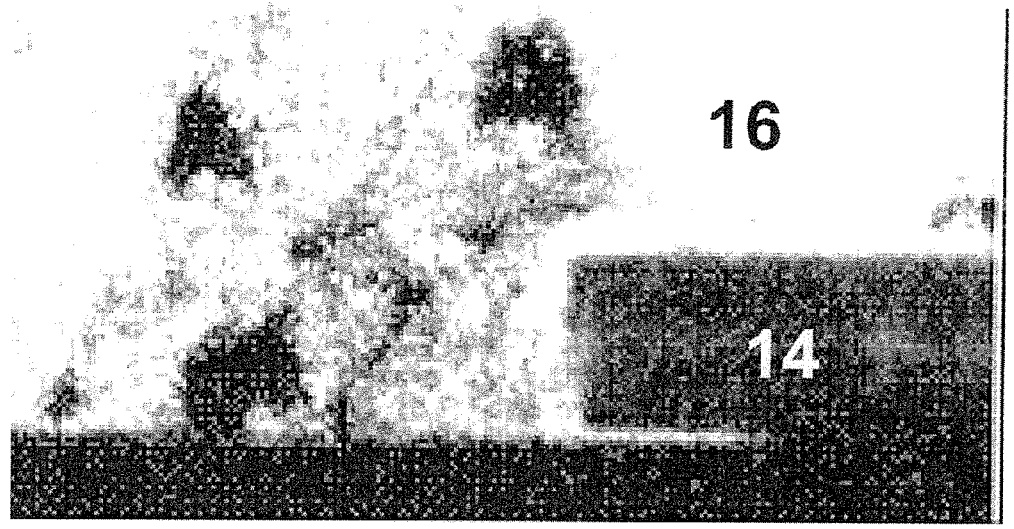
FIG. 5a is a mapping image of selenium in the prior art CIS-based thin film solar cell using TEM (transmission electron microscope)-EDX (energy dispersive x-ray spectroscopy).
Figure 5B:
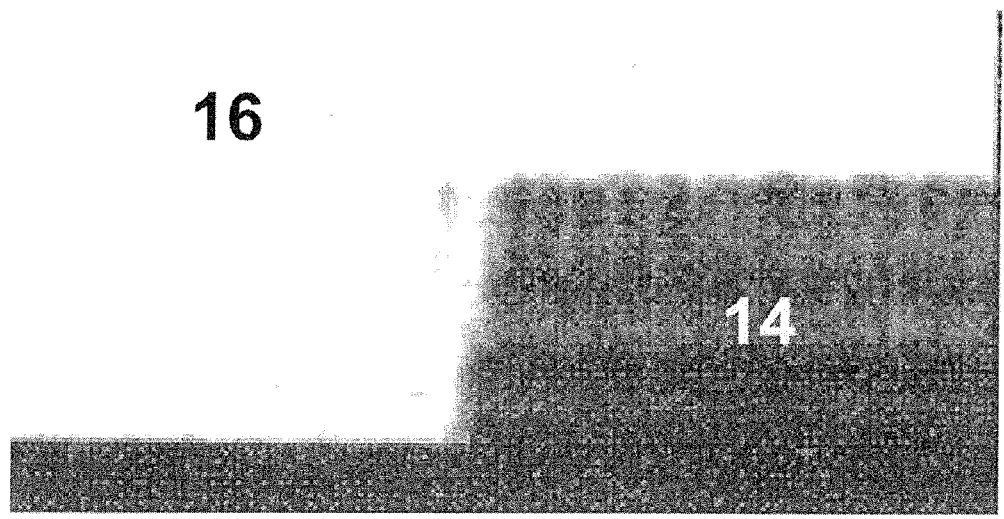
FIG. 5b is a mapping image of selenium in a CIS-based thin film solar cell in accordance with the embodiment of the present invention using TEM-EDX.
Figure 6A:
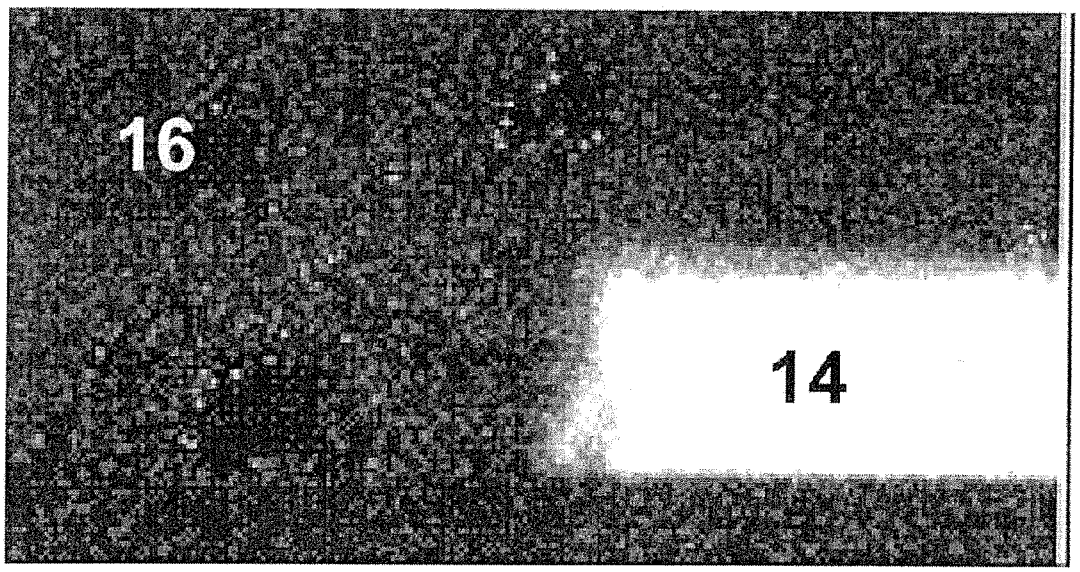
FIG. 6a is a mapping image of molybdenum in the prior art CIS-based thin film solar cell using TEM (transmission electron microscope)-EDX (energy dispersive x-ray spectroscopy).
Figure 6B:
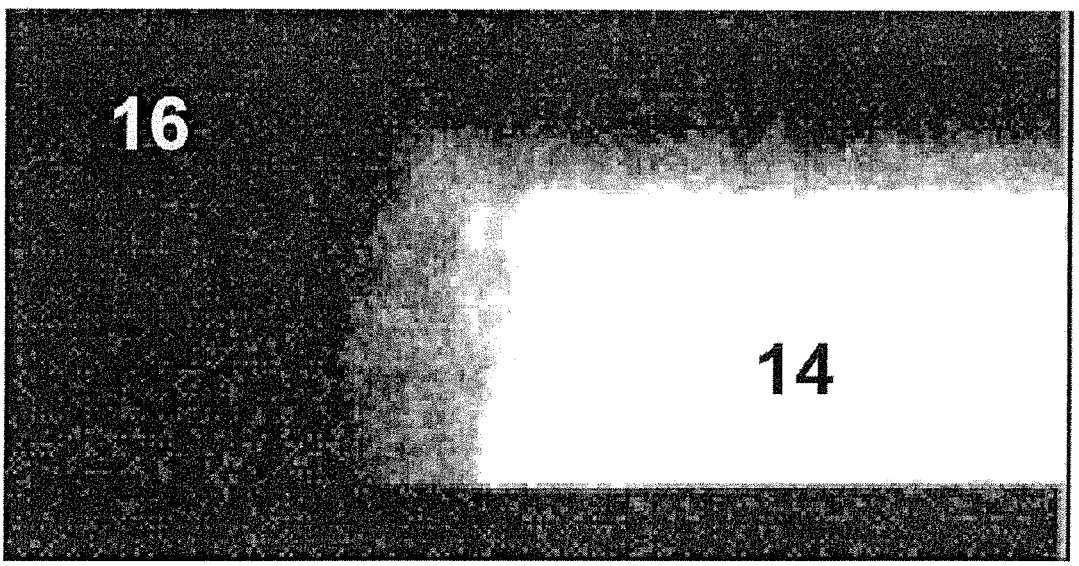
FIG. 6b is a mapping image of molybdenum in a CIS-based thin film solar cell in accordance with the embodiment of the present invention using TEM-EDX.

Next, a structure of the backside electrode layer 14 adjoining the pattern 1 (P1) in the CIS-based thin film solar cell 10 in accordance with the present embodiment will be described with reference to FIG. 2. FIG. 2 is a schematic diagram showing an enlarged view of the portion marked A in FIG. 1. It should be noted that FIG. 2 is only a schematic diagram representing the elements of the cell using symbols to be more easily interpreted by the viewer and does not represent the actual proportions (film thicknesses and the like) of the backside electrode layer 14 and intermediate layer 20 (which will be described later).

As is indicated in FIG. 2, the intermediate layer 20 of $MoSe_2$, $MoS_2$ or $Mo(SSe)_2$, which is a compound of molybdenum (Mo) constituting the backside electrode layer 14 and Group VI element (selenium and/or sulfur) constituting the light absorption layer 16, is deposited on the surface of the backside electrode layer 14 that is in contact with the light absorption layer 16. The intermediate layer 20 is formed as a result of a chemical reaction of Mo of the backside electrode layer 14 with Se and/or S of the light absorption layer 16 during the selenization process, sulfurization process, or deposition process of the light absorption layer, conducted to form the light absorption layer 16. In the following description, as shown in FIG. 2, the intermediate layer 20 formed on the top surface parallel to the substrate 12 is treated as first intermediate layer 20a having a film thickness a and the intermediate layer 20 formed on the lateral surface that is vertical to the substrate 12 and opposed to the pattern 1 (P1) is treated as second intermediate layer 20b having a film thickness b.

Next, referring to FIGS. 3-6, a conventional CIS-based thin film solar cell experimentally made by the present inventor (hereafter referred to as "prior art") and a CIS-based thin film solar cell in accordance with the present embodiment of the present invention will be compared in terms of structure and advantageous effects. FIG. 3a is a cross-section STEM (scanning transmission electron microscope) image of the prior art CIS-based thin film solar cell. FIG. 3b is a cross-section STEM image of a CIS-based thin film solar cell in accordance with the embodiment of the present invention. FIG. 4a is a mapping image of sulfur in the prior art CIS-based thin film solar cell using EELS (electron energy-loss spectroscopy). FIG. 4b is a mapping image of sulfur in a CIS-based thin film solar cell in accordance with the embodiment of the present invention using EELS. FIG. 5a is a mapping image of selenium in the prior art CIS-based thin film solar cell using TEM (transmission electron microscope)-EDX (energy dispersive x-ray spectroscopy). FIG. 5b is a mapping image of selenium in a CIS-based thin film solar cell in accordance with the embodiment of the present invention using TEM-EDX. FIG. 6a is a mapping image of molybdenum in the prior art CIS-based thin film solar cell using TEM-EDX. FIG. 6b is a mapping image of molybdenum in a CIS-based thin film solar cell in accordance with the embodiment of the present invention using TEM-EDX.

With reference to a combination of FIGS. 3-6, there is no difference between the film thickness a of the first intermediate layer 20a and the film thickness b of the second intermediate layer 20b in the prior art. In contrast, the present embodiment has the film thickness b of the second intermediate layer 20b larger than the film thickness a of the first intermediate layer 20a. In a preferred embodiment of the present invention, the film thickness b is at least twice as large as the film thickness a.

The intermediate layer 20 comprised of a compound of Mo and Se and/or S has a higher resistivity than the light absorption layer 16. Taking advantage of the feature, the present embodiment increases the film thickness of the second intermediate layer 20b thereby to increase the resistance value of a shunt indicated as a shunt path (20c) in FIG. 2, which in turn reduces the leakage current flowing through the shunt path (20c) and, in other words, increases shunt resistance ($R_{sh}$).

The following Table 1 sets forth fill factors (FF: Fill Factor) and shunt resistance values ($R_{sh}$) of the prior art and CIS-based thin film solar cell in accordance with the present embodiment shown in FIGS. 3-6.

TABLE 1

| Fill Factor (FF) and shunt resistance value ($R_{sh}$) | | |
|---|---|---|
| | Prior art | Embodiment |
| FF | 0.615 | 0.638 |
| $R_{sh}$ ($\Omega cm^2$) | 430.5 | 977.8 |

As indicated in Table 1, a CIS-based thin film solar cell of the present embodiment has an improved shunt resistance value and a significantly improved fill factor, compared to the prior art.

Hypothetically, if the film thickness of the first intermediate layer 20a were also increased with the increase in the film thickness of the second intermediate layer 20b, then series resistance (Rs), which is one of the key parameters for evaluating the performance of a solar cell, would increase, which cancels out the effects of significantly improved shunt resistance and therefore does not result in an improved, higher fill factor. Taking this into consideration, the present invention makes the film thickness of the second intermediate layer 20b greater than that of the first intermediate layer 20a, instead of merely increasing the film thickness of the second intermediate layer 20b, thereby to improve a fill factor (FF).

<Method of Manufacture>

Next, a method of manufacture of the CIS-based thin film solar cell 10 of the present embodiment will be specifically described with reference to FIGS. 7-9.

Figure 7:
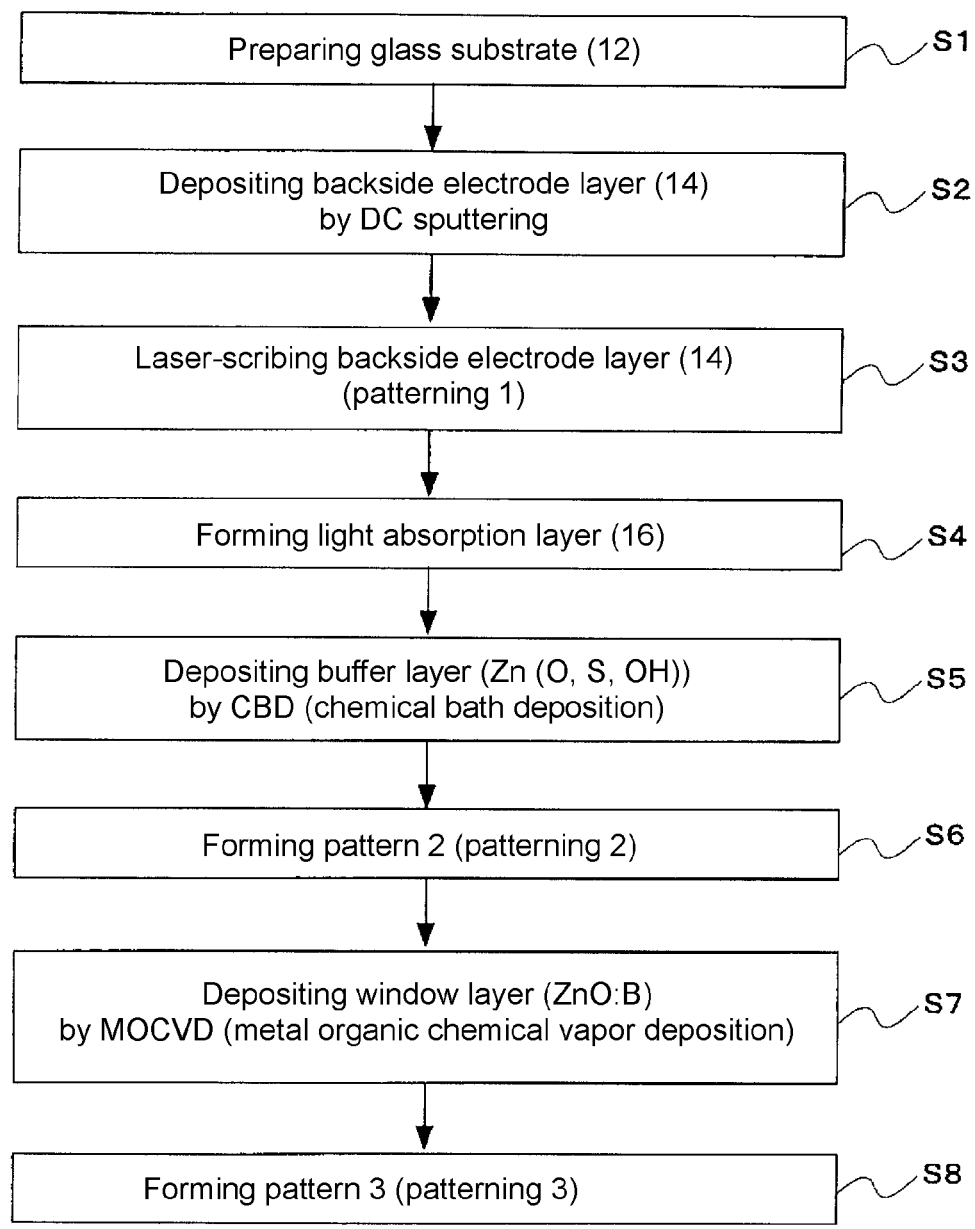
FIG. 7 is a flow chart describing the process of fabrication of a CIS-based thin film solar cell in accordance with the embodiment of the present invention.
Figure 8:
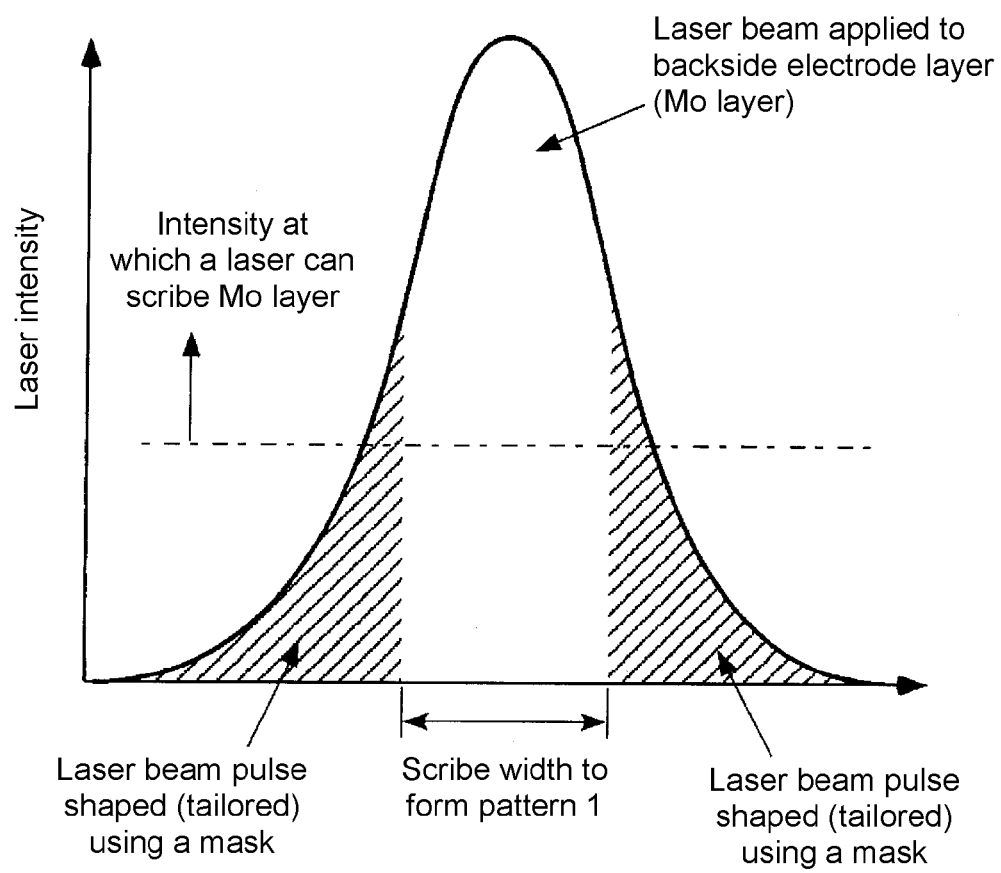
FIG. 8 is an explanatory drawing showing the intensity distribution of laser beam used to form the pattern 1 (P1) for the prior art CIS-based thin film solar cell.

At step S1 in FIG. 7 the substrate 12 is prepared. The present embodiment uses a glass substrate as the substrate 12. However, other substrates such as a metal substrate made of a stainless steel sheet, a resin substrate made of polyimide film, or the like may be employed.

Next, at step S2, a Mo thin film is deposited on the substrate 12 by DC sputtering or the like to form the backside electrode layer 14 having a film thickness of 200 nm-500 nm. Optionally, an alkali-control layer made of $SiO_x$ or the like may be formed between the substrate 12 and the backside electrode layer 14. Such an alkali-control layer can control thermal diffusion of the alkali metals (Na and the like) contained in the glass substrate, into the light absorption layer 16. Further, electrode materials for the backside electrode layer 14 may include refractory metal having excellent resistance to selenium corrosion such as Ti (titanium), Cr (chromium) or the like.

At step S3, the backside electrode layer 14 formed on the substrate 12 is laser-scribed at regular intervals with a predetermined scribe width to form pattern 1 (P1). As indicated in FIG. 8, a mask is employed in the prior art to tailor the shape of a laser beam pulse so that the laser beam width corresponds to the width of pattern 1 (P1) (scribe width). By tailoring the laser beam shape as indicated in FIG. 8, the prior art generates pattern 1 (P1) at a desired width while minimizing damage to the edge (lateral surface that is in contact with pattern 1 (P1)) of the backside electrode layer 14 formed vertical to the glass substrate 12.

Figure 9:
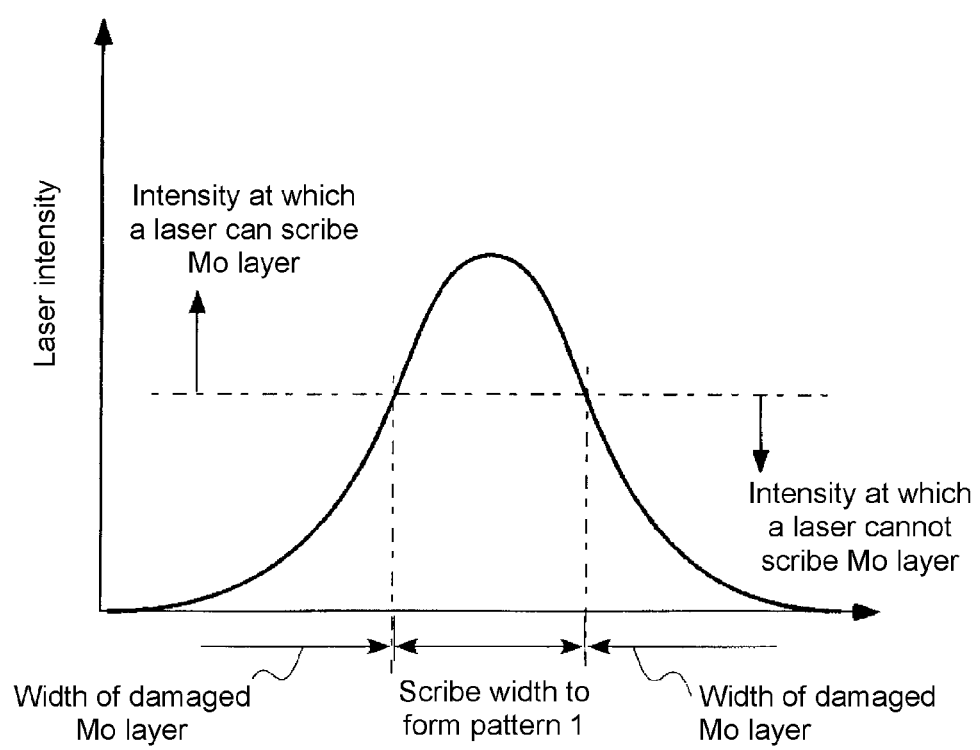
FIG. 9 is an explanatory drawing showing the intensity distribution of laser beam used to form the pattern 1 (P1) for a CIS-based thin film solar cell in accordance with the embodiment of the present invention.

In contrast, the present embodiment controls the width of pattern 1 (P1) by adjusting the laser output intensity without using a mask, as is indicated in FIG. 9. More specifically, a threshold value of energy intensity, at which a laser can scribe the backside electrode layer 14, is determined and the laser output intensity is adjusted so that the width of a laser beam whose energy intensity is not less than the threshold value corresponds to the width of pattern 1 (P1). Since, unlike the prior art, no masks are employed in the present embodiment, the edge of the backside electrode layer 14 adjacent to pattern 1 (P1) is irradiated with a laser beam whose energy intensity is less than the threshold value. Thus, no masks are employed in the present embodiment, whereby the edge of the backside electrode layer 14 is irradiated with a laser beam, whose energy intensity is less than the threshold value, and the edge of the backside electrode layer 14 is intentionally damaged.

The thus damaged edge part of the backside electrode layer 14 becomes more reactive towards Group VI elements, i.e., selenium and sulfur during the fabrication process of the light absorption layer 16 at step S4 described below, which results in the formation of the second intermediate layer 2b whose film thickness is larger than that of the first intermediate layer 2a.

Next, the formation of the light absorption layer 16 at step S4 will be specifically described. First, a Cu—Ga layer and an In layer are deposited by DC sputtering on the backside electrode layer 14, upon which pattern 1 (P1) is generated, thereby to form a metal precursor film on the substrate. Next, the substrate on which the metal precursor film is formed is heat-treated and selenized at a temperature in the range of 350-500° C. in the furnace, into which $H_2Se$ gas is injected. Further, the $H_2Se$ gas in the furnace is substituted with an $H_2Se$ gas, and the selenized substrate is heat-treated and sulfurized at a temperature in the range of 550-650° C. In the present embodiment, the ratio of the number of atoms of Cu to the number of atoms of Group III elements, i.e., In and Ga, (Cu/Group III elements ratio) is 0.85-0.95 and the ratio of the number of atoms of Ga to the number of atoms of Group III elements (Ga/Group III elements ratio) is 0.15-0.4, and selenization and sulfurization processes are conducted at 350° C.-600° C. and 550° C.-650° C. respectively to form the light absorption layer 13 having a film thickness of 1.0-2.0 μm.

Thus, as the light absorption layer 16 of the present embodiment is a $Cu(InGa)(SeS)_2$ film formed by the selenization and sulfurization processes, the intermediate layer 20 is comprised of $Mo(SSe)_2$ obtained as a result of the reaction of Mo with Se and S.

The light absorption layer 16 of the present invention may be comprised of, for example, $CuInSe_2$, $Cu(InGa)Se_2$, $CuGaSe_2$, $CuInS_2$, $Cu(InGa)S_2$, $CuGaS_2$ or the like obtained by either selenization or sulfurization. When only the selenization process is performed, the intermediate layer 20 is a $MoSe_2$ film, whereas when only the sulfurization process is performed, the intermediate layer 20 is a $MoS_2$ film. In the present embodiment, the intermediate layer 20 is a $Mo(SSe)_2$ film whose resistivity is higher than that of a $MoSe_2$ film which would be formed as the intermediate layer 20 when only the selenization process is performed. Accordingly, the present embodiment, where both the selenization and sulfurization steps are performed, is more effective in preventing shunts in a solar cell than a CIS-based solar cell fabricated by performing only the selenization process.

Although an In film is deposited as a metal precursor film on a CuGa film in the present embodiment, it may be a Cu—Ga—In alloy film, Cu—In alloy film, Cu/In laminate film or the like.

Next at step S5, a 2-50 nm-thick buffer layer of $Zn(O,S,OH)_x$ is deposited by CBD (chemical bath deposition). In another embodiment, a buffer layer may be a Group II-VI compound semiconductor thin film such as CdS, ZnS, ZnO or the like or a thin film containing a mixed crystal of the foregoing compounds. In still another embodiment, a buffer layer may be an In-compound semiconductor thin film such as $In_2O_3$, $In_2S_3$, $In(OH)$ or the like. Although the present embodiment employs a CBD method to deposit thin films, other deposition techniques such as MOCVD (metal organic chemical vapor deposition) may be used.

Next, at step S6, the light absorption layer 16 and the buffer layer are removed by mechanical scribing to form pattern 2 (P2) of a predetermined width at regular intervals. In another embodiment, pattern 2 (P2) may be formed by laser scribing instead of mechanical scribing.

Next, at step S7, the transparent conductive film 18 is deposited by MOCVD. In a preferred embodiment, the composition of the conductive film is ZnO:B and the film thickness is 0.5-2.5 μm. The transparent conductive film 18 preferably possesses a wide band gap that exhibits n-type conductivity, and has optical transparency and low resistivity. In another embodiment, the transparent conductive film 18 may be comprised of a zinc oxide thin film, which may be doped with any one of or a combination of Group III elements, for example, aluminum (Al), gallium (Ga), boron (B). In still another embodiment, the transparent conductive film 18 may be comprised of ITO (indium tin oxide), which can be deposited by sputtering instead of MOCVD.

Furthermore, when forming the transparent conductive film 18 on the buffer layer, a non-doped ZnO may be first deposited as an additional buffer layer, and the transparent conductive film 18 may be formed on the additional buffer layer.

Still further, at step S8, the light absorption layer 16, the buffer layer and the transparent conductive layer 18 are removed by mechanical scribing thereby to generate pattern 3 (P3) of a predetermined width at regular intervals. In another embodiment, pattern 3 (P3) may be formed by laser scribing instead of mechanical scribing.

In the present embodiment, as mentioned above, a laser beam applied to generate pattern 1 (P1) is adjusted intentionally to damage the edge of the backside electrode layer 14 adjacent to pattern 1 (P1) so that the film thickness of the second intermediate layer 20b is larger than the film thickness of the first intermediate layer 20a. However, the present invention is in no way limited to the foregoing fabrication process and other processes may be employed.

REFERENCE SIGNS LIST

10: CIS-based thin film solar cell
12: substrate
14: backside electrode layer
16: light absorption layer
18: transparent conductive film
20: intermediate layer
20a: first intermediate layer
20b: second intermediate layer
20c: shunt path
a: thickness
b: thickness
P1: pattern 1
P2: pattern 2
P3: pattern 3

The invention claimed is:

1. A CIS-based thin film solar cell fabricated by sequentially depositing a backside electrode layer divided by a dividing groove, a CIS-based light absorption layer and a transparent conductive film on a substrate,
   wherein said backside electrode layer comprises an intermediate layer on a surface that is in contact with the CIS-based light absorption layer, said intermediate layer being composed of a compound of a metal that constitutes the backside electrode layer and a group VI element that constitutes the CIS-based light absorption layer,
   wherein the surface comprises an upper surface and a lateral surface,
   wherein said intermediate layer comprises a first intermediate layer portion formed on the upper surface that is parallel to the substrate and a second intermediate layer portion formed on the lateral surface that is vertical to the substrate and opposed to the dividing groove, and
   wherein a film thickness of the second intermediate layer portion along a direction horizontal to the substrate is larger than that of the first intermediate layer portion along a direction vertical to the substrate.

2. The CIS-based thin film solar cell of claim 1, wherein the film thickness of the second intermediate layer portion is at least twice as large as that of the first intermediate layer portion.

3. The CIS-based thin film solar cell of claim 1 or 2,
   wherein said backside electrode layer is made of Mo;
   said group VI element includes at least sulfur; and
   said intermediate layer consists of at least one of $MoS_2$ layer and $Mo(SSe)_2$ layer.

* * * * *